US008848471B2

(12) United States Patent
Franceschini et al.

(10) Patent No.: US 8,848,471 B2
(45) Date of Patent: Sep. 30, 2014

(54) METHOD FOR OPTIMIZING REFRESH RATE FOR DRAM

(75) Inventors: Michele M. Franceschini, White Plains, NY (US); Hillery C. Hunter, Deerfield, IL (US); Ashish Jagmohan, Irvington, NY (US); Charles A. Kilmer, Essex Junction, VT (US); Kyu-hyoun Kim, Mount Kisco, NY (US); Luis A. Lastras, Cortlandt Manor, NY (US); Moinuddin K. Qureshi, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/569,486

(22) Filed: Aug. 8, 2012

(65) Prior Publication Data

US 2014/0043927 A1 Feb. 13, 2014

(51) Int. Cl.
*G11C 29/00* (2006.01)
*G11C 29/50* (2006.01)

(52) U.S. Cl.
CPC .................................... *G11C 29/50* (2013.01)
USPC ............................ 365/201; 365/222; 365/200

(58) Field of Classification Search
CPC ....... G11C 29/50; G11C 11/401; G11C 29/02
USPC .......................................... 365/201, 222, 200
See application file for complete search history.

(56) References Cited

U.S. PATENT DOCUMENTS

| | | | | |
|---|---|---|---|---|
| 4,736,344 | A | 4/1988 | Yanagisawa | |
| 6,483,764 | B2 | 11/2002 | Chen Hsu et al. | |
| 6,728,156 | B2 | 4/2004 | Kilmer et al. | |
| 6,862,240 | B2 * | 3/2005 | Burgan | 365/222 |
| 6,920,523 | B2 | 7/2005 | Le et al. | |
| 7,035,155 | B2 * | 4/2006 | Stimak et al. | 365/222 |
| 7,095,669 | B2 | 8/2006 | Oh | |
| 7,206,244 | B2 | 4/2007 | Cruz et al. | |
| 7,233,538 | B1 | 6/2007 | Wu et al. | |
| 7,305,518 | B2 | 12/2007 | Zeighami et al. | |
| 7,444,577 | B2 | 10/2008 | Best et al. | |
| 7,483,319 | B2 * | 1/2009 | Brown | 365/200 |
| 7,515,494 | B2 | 4/2009 | Butler | |
| 7,565,479 | B2 | 7/2009 | Best et al. | |
| 7,734,866 | B2 | 6/2010 | Tsern | |
| 7,742,355 | B2 * | 6/2010 | Kohler et al. | 365/222 |

OTHER PUBLICATIONS

Borden et al., "On Coding for 'Stuck-at' Defects (Corresp).", IEEE Transactions on Information Theory, vol. 33, Issue 5, 1983. pp. 729-735. DOI: 10.1109/TIT.1987.1057347.

Heegard et al., "On the Capacity of Computer Memory with Defects", IEEE Transactions on Information Theory, vol. 29, Issue 5, 1983. pp. 731-739. DOI: 10.1109/TIT.1983.1056723.

(Continued)

*Primary Examiner* — Connie Yoha

(74) *Attorney, Agent, or Firm* — Peder M. Jacobson; Robert R. Williams

(57) ABSTRACT

A method for determining an optimized refresh rate involves testing a refresh rate on rows of cells, determining an error rate of the rows, evaluating the error rate of the rows; and repeating these steps for a decreased refresh rate until the error rate is greater than a constraint, at which point a slow refresh rate is set.

20 Claims, 5 Drawing Sheets

101
Set Test Refresh Rate ($R_x$) and Previous Test Refresh Rate ($R_{x-1}$) to Fast Refresh Rate ($R_f$) 301
Test rows at Test Refresh Rate ($R_x$) 302
Determine Test Refresh Rate ($R_x$) 307
Determine Row Error ($E_x$) at Test Refresh Rate ($R_x$) 303
Determine Row Error Difference ($D_x$) 401
102
Determine Row Error Difference Constraint ($C_{dx}$) 402
103
Is $D_x$ greater than $C_{dx}$? 403
Yes
No
Store Test Refresh Rate ($R_x$) as Previous Test Refresh Rate ($R_{x-1}$) and Row Error ($E_x$) as Previous Row Error ($E_{x-1}$) 404
Set Slow Refresh Rate ($R_s$) to Previous Test Refresh Rate ($R_{x-1}$) 308
104

(56) References Cited

OTHER PUBLICATIONS

Heegard, "Partitioned Linear Block Codes for Computer Memory with 'Stuck-at' Defects", IEEE Transactions on Information Theory. vol. 29, No. 6, Nov. 1983. pp. 831-842. DOI: 10.1109/TIT.1983.1056763.
Idei, Y. et al, "Dual-Period Self-Refresh Scheme for Low-Power DRAM's with On-Chip PROM Mode Register", IEEE Journal of Solid-State Circuits, Feb. 1998, pp. 253-259, vol. 33, No. 2. DOI: 10.1109/4.658627.
Kim, J., & Papaefthymiou, M., "Dynamic Memory Design for Low Data-Retention Power", Proceedings of the 10th International Workshop on Integrated Circuit Design, Power and Timing Modeling, Optimization and Simulation, PATMOS '00, in Lecture Notes in Computer Science, vol. 1918/2000 Springer-Verlag, 2000, pp. 207-216.
Kim, J., & Papaefthymiou, M., "Block-Based Multi-Period Refresh for Energy Efficient Dynamic Memory", 14th Annual IEEE International ASIC/SOC Conference 2001, Sep. 12-15, 2001. IEEE Issue 7 Aug. 2002. pp. 193-197. DOI: 10.1109/ASIC.2001.954696.
Kim, J., & Papaefthymiou, M., "Block-Based Multi-Period Dynamic Memory Design for Low Data-Retention Power", IEEE Transactions on Very Large Scale Integration (VLSI) Systems, Dec. 2003, pp. 1006-1018, vol. 11, No. 6. DOI: 10.1109/TVSLI.2003.817524.
Krishnamoorthy et al., "Error Control to Increase the Yield of Semiconductor RAM's", The 1998 IEEE/CAM Information Theory Workshop at Cornell, 1989. DOI: 10.1109/ITW.1989.761432.
Ohsawa et al., "Optimizing the DRAM Refresh Count for Merged DRAM/Logic LSIs", International Proceedings on Low Power Electronics and Design, 1998. pp. 82-87.
Venkatesan et al., "Retention-Aware Placement in DRAM (RAPID): Software Methods for Quasi-Non-Volatile DRAM", The 12th International Symposium on High Performance Computer Architecture, 2006. pp. 157-167. DOI: 10.1109/HPCA.2006.1598122.
U.S. Appl. No. 12/433,157, filed Apr. 30, 2009, "Increased Capacity Heterogeneous Storage Elements", Elfadel et al.
U.S. Appl. No. 12/553,400, filed Sep. 3, 2009, "Advanced Memory Device Having Improved Performance, Reduced Power and Increased Reliability", Chiu et al.
U.S. Appl. No. 12/814,142, filed Jun. 11, 2010, "Encoding Data Into Constrained Memory", Franceschini et al.
U.S. Appl. No. 12/963,797, filed Dec. 9, 2010, "Memory System With a Programmable Refresh Cycle", Kilmer et al.

* cited by examiner

METHOD FOR OPTIMIZING REFRESH RATE FOR DRAM

TECHNICAL FIELD

This disclosure relates to dynamic RAM refresh. In particular, it relates to a method for quickly identifying a power-efficient refresh interval.

BACKGROUND

Dynamic memory cells store a charge on a capacitor. The capacitor loses its charge over time and must be periodically refreshed. This refresh operation consumes resources and locks up the memory from performing other operations during the refresh, such as reading and writing. The frequency with which a particular capacitor will need refreshing depends on the construction and manufacture of the chip. On the same chip and often the same row, some capacitors may hold a charge on the order of milliseconds, while other capacitors may hold a charge on the order of seconds.

SUMMARY

In an embodiment, this disclosure relates to a method for determining a slow refresh rate for DRAM having at least a fast and a slow refresh rate, which includes testing the DRAM rows at a test refresh rate, determining an error rate, evaluating the error rate against a constraint; and determining the slow refresh rate if the error rate is greater than the constraint.

In another embodiment, this disclosure relates to a controller for determining an optimized refresh rate which includes a memory error test circuit, a determination circuit, and an evaluator logic unit. The memory test circuit may be used for testing output at a test refresh rate. The determination circuit may be used for determining an error rate of the rows of cells. The evaluator logic unit may be used for evaluating the error rate against a constraint and setting a slow refresh rate when the error rate is greater than the constraint.

In another embodiment, this disclosure relates to a method for optimizing refresh rate, which includes testing rows of cells at a refresh rate with a memory error test circuit, determining an error rate of the rows of cells with a determination circuit, evaluating the error rate against a constraint with an evaluator logic unit, and setting a slow refresh rate when the error rate is greater than the constraint with the evaluator logic unit.

BRIEF DESCRIPTION OF THE DRAWINGS

The drawings included in the present application are incorporated into, and form part of, the specification. They illustrate an embodiment of the present invention and, along with the description, serve to explain the principles of the invention. The drawings are only illustrative of a typical embodiment of the invention and do not limit the invention.

DETAILED DESCRIPTION

Dynamic random access memory (DRAM) must be periodically refreshed, as the capacitors that store a charge in the DRAM may leak the charge over time. However, these capacitors do not all lose charge at the same rate or require refreshing at the same frequency. Due to manufacturing variations and defects, some DRAM cells may leak or pick up charge at different rates than other cells. Rows having cells with capacitors poor at holding a charge must be refreshed at a faster rate than the majority of rows, which may have cells that are strong at holding a charge.

Traditionally, each row of the DRAM was refreshed at the refresh rate required for the weakest cells; this ensured that all the DRAM cells were refreshed before losing their charge. Refreshing DRAM consumes power and resources, and minimizing the total refresh time for the DRAM may reduce the power consumption of the DRAM and free up time and resources for reading and writing operations.

According to the principles of the invention, optimization of time spent on refresh may occur through a system of multiple refresh rates including a fast refresh rate suitable to retain data on a weakest cell in a particular DRAM technology, and a slow refresh rate for rows with cells that are able to retain their charge over the refresh interval. The fast refresh rate may be the rate at which the weakest cells in a row require refreshing. The slow refresh rate may be a calculated or adjustable refresh rate. Any row of cells that may not be adequately refreshed at the slow refresh rate may be refreshed at the fast refresh rate. Given enough resources, a machine could determine the optimum slow refresh rate for a given DRAM; however, this may take significant time and resources. Aspects of the invention relate to a method for quickly establishing an ideal slow refresh rate for use in conjunction with a fast refresh rate to reduce overall refresh time for a DRAM. Refresh rate as it is used in the disclosure refers to the length of time between refreshes for a row of cells; for example, the refresh rate may be expressed in units of row/milliseconds. Because the row is referenced as a whole unit, the time unit will be the variable unit. Refresh rate may also be discussed in terms of a refresh interval, and it is known that discussing a refresh interval for a row is the same as discussing the refresh rate of the row. Using refresh interval instead of refresh rate does not change the operation of the method, as it is known to convert one to the other. For example, refresh interval may be the reciprocal of refresh rate.

According to the principles of the invention, a method for optimizing refresh rate involves testing rows at a refresh rate, determining an error rate of the rows at that refresh rate, and comparing the error rate to a constraint. These steps may be repeated for a number of iterations with a decreased refresh rate until the constraint is violated, at which point a slow refresh rate may be set.

Figure 1:
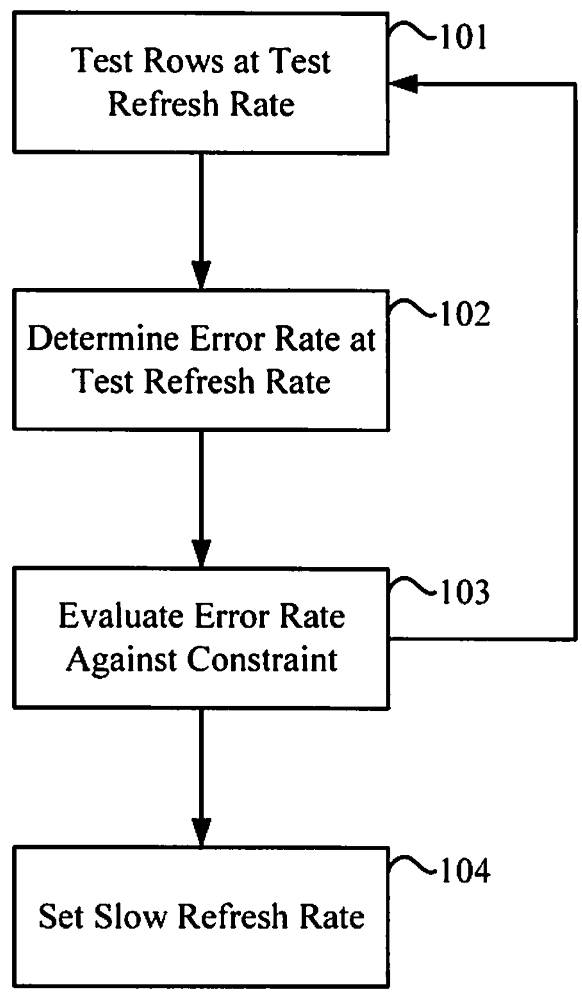
FIG. 1 is a flowchart of an overall refresh optimization method, according to embodiments of the invention.

FIG. 1 is a flowchart a refresh rate optimization method, according to embodiments of the invention. In operation 101, the rows are tested at a test refresh rate. In operation 102, the error rate of the rows is determined for the test refresh rate. In operation 103, the error rate at the test refresh rate is evaluated against a constraint. If the constraint is not violated, the rows are tested at a new test refresh rate, as in operation 101. If the constraint is violated, the slow refresh rate is set, as in operation 104.

According to principles of the invention, the total refresh time of the DRAM is a function of the number of rows of cells requiring a fast refresh rate ("fast rows"), the number of rows of cells refreshed at a slow refresh rate ("slow rows"), and the fast and slow refresh rates for those respective rows. This relationship may be represented in the following equation:

$$T_R = \frac{N_F}{R_F} + \frac{N_S}{R_S}$$

where $T_R$ is the total refresh time, $R_F$ is the fast refresh rate, $N_F$ is the number of fast rows, $R_S$ is the slow refresh rate, and $N_S$ is the number of slow rows. For purposes of understanding the relationship of the fast and slow cells, assume that the slow refresh rate is initially set to the fast refresh rate and that all rows start as slow rows. As the slow refresh rate is decreased, more rows will fail to hold a charge for the refresh period, increasing the number of rows requiring a fast refresh. There exists an optimum slow refresh rate for the DRAM that balances a lower slow refresh rate with a higher number of fast rows.

Figure 2A:
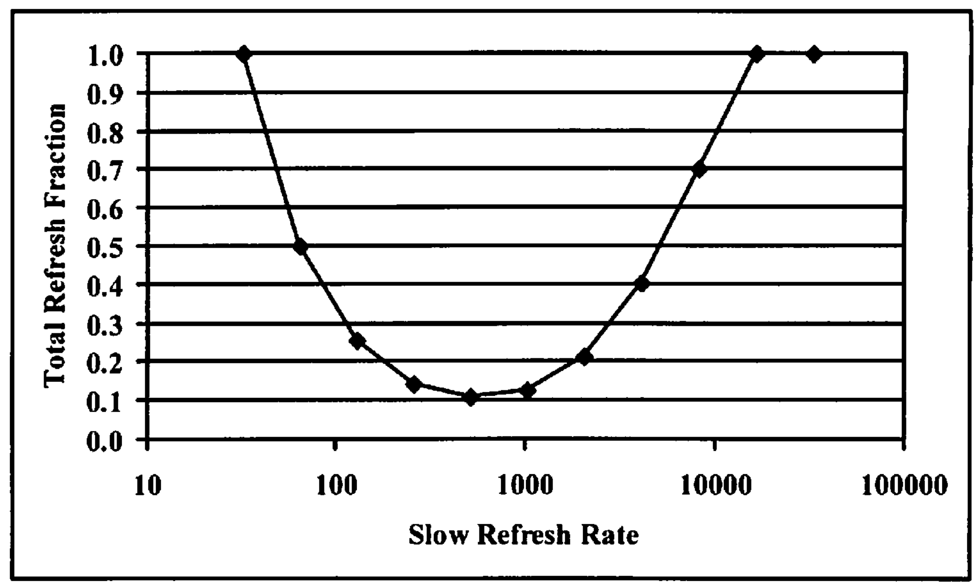
FIG. 2A is a graphical representation of the total refresh fraction vs. slow refresh rate.
Figure 2B:
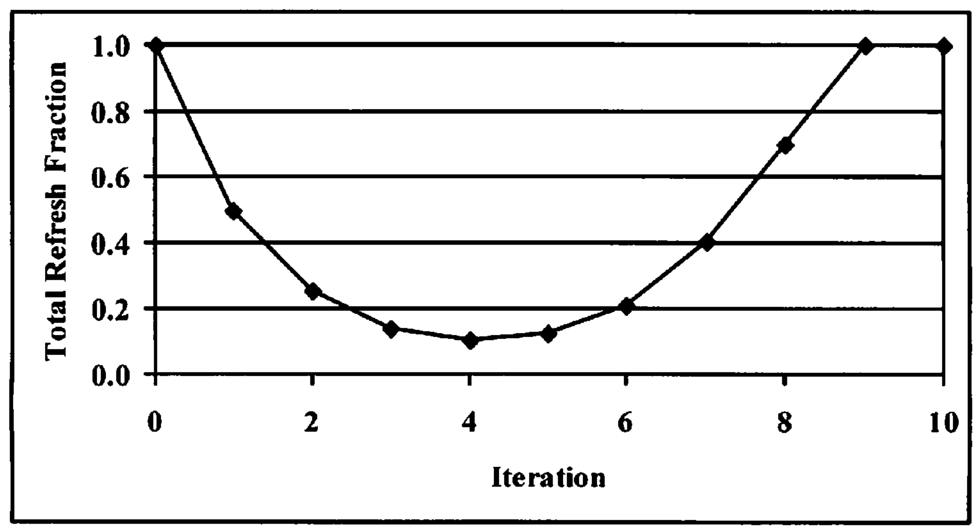
FIG. 2B is a graphical representation of the total refresh fraction vs. iterations of a method, according to embodiments of the invention.

FIG. 2A and FIG. 2B are graphical representations of the total refresh time for a hypothetical DRAM whose cells exhibit exponential distribution for their charge-holding capabilities; the shape of these graphs may change depending on the properties of the DRAM. In FIG. 2A, the graph shows total refresh fraction vs. slow refresh rate. The x-axis represents the slow refresh rate, plotted on a logarithmic scale. The y-axis represents total refresh fraction, which is the total refresh time of the DRAM as a fraction of the refresh time the DRAM would have to spend if all the rows were refreshed at the fast refresh rate, represented by the following equation:

$$X_R = \frac{T_R R_F}{N_T}$$

where $X_R$ is the total refresh fraction, $T_R$ is the total refresh time, discussed above, $R_F$ is the fast refresh rate, and $N_T$ is the total number of rows to be refreshed, which ordinarily would be the total of fast rows and slow rows. The optimum slow refresh rate is shown by the minimum in the plot, which corresponds to the lowest total time spent on refreshing.

FIG. 2B is a graphical representation of the total refresh time vs. the number of iterations of an optimization method performed. The x-axis represents the number of iterations performed by the method, while the y-axis is total refresh fraction, as discussed above in FIG. 1A. The optimum refresh rate for FIG. 2B would be four iterations, as seen by the graphical minimum; however, other refresh rates may still improve the refresh rate for the DRAM. Because the refresh rate determination takes time and resources, it may be advantageous in some embodiments to stop after fewer than four iterations of the method.

Alternatively, according to principles of the invention, total refresh time in a DRAM is improved by testing the DRAM rows for their ability to hold a value for a refresh interval at a test refresh rate. The total refresh time is evaluated at the test refresh rate, wherein the total refresh time is a function of the fast refresh rate, the test refresh rate, and the respective number of cells that fail and succeed at holding a value for the test interval. According to this embodiment, the test is repeated at a changed test refresh rate until the total refresh time begins to increase, at which point the slow refresh rate is set.

Optimization Using Row Error

Figure 3:
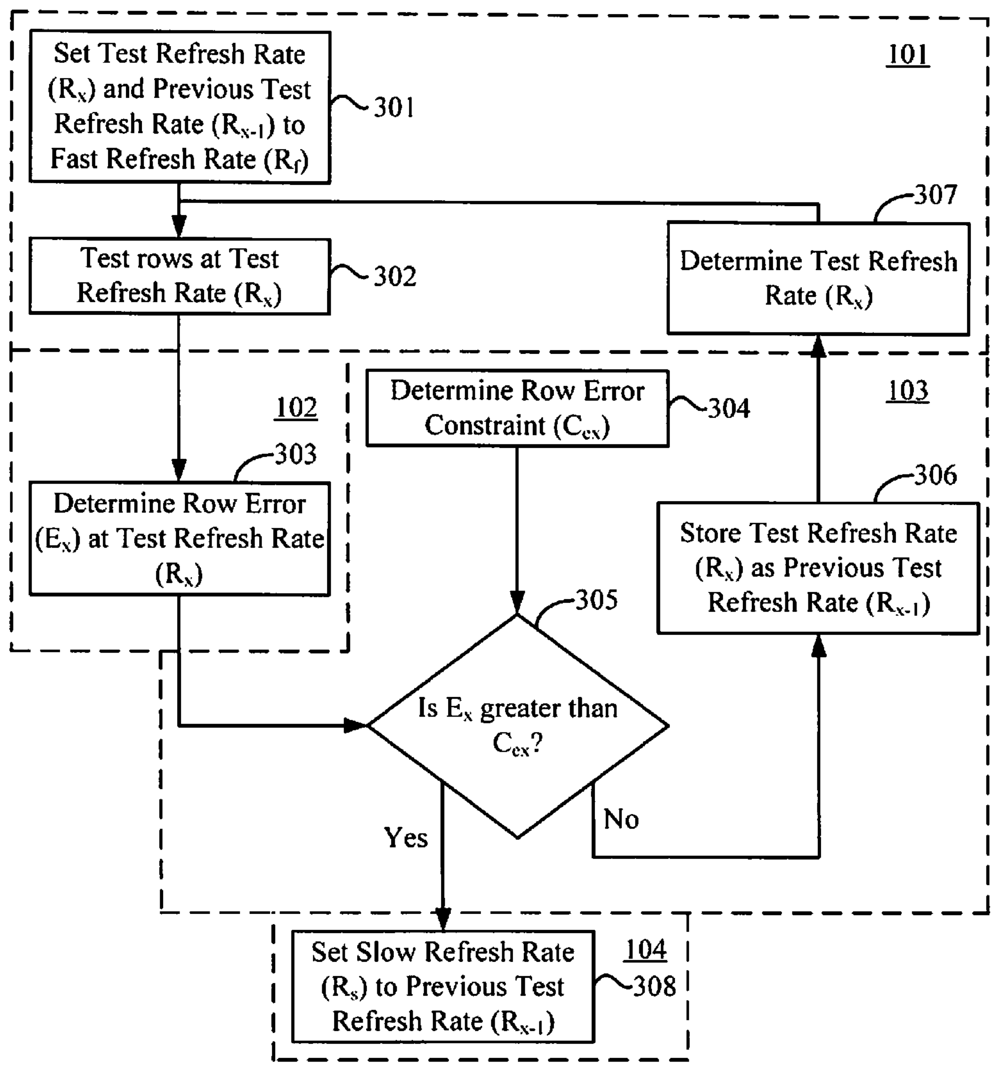
FIG. 3 is a flowchart of a refresh rate optimization method using row error, according to an embodiment of the invention.

FIG. 3 is a flowchart of an embodiment of the invention utilizing row error for determining a slow refresh rate. The steps of FIG. 1 are represented by hashed marks within FIG. 3, and are discussed in detail below.

Testing Rows

The rows may be tested at a refresh rate, as in operation 101. For a first test refresh rate iteration, the test refresh rate may be the fast refresh rate for the DRAM, as in 301. This fast refresh rate is often tested and defined by the DRAM manufacturer. The fast refresh rate may change depending on environmental factors of the DRAM, such as temperature. The fast refresh rate may be determined with a test itself, where the test establishes the refresh rate required for a certain threshold of cells or rows to hold their charge; for example, an acceptable error may be 0.0001% of all cells. Alternatively, the test refresh rate may be a known refresh rate for which all the cells may hold their charge; this may be refresh information stored from a previous test.

For iterations after the first iteration, the test refresh rate may be determined by applying a refresh rate factor to the previous test refresh rate, as shown in operation 307. This determination may be represented in the following equation:

$$R_x = \frac{R_{x-1}}{K_R}$$

where $R_x$ is the current test refresh rate, $R_{x-1}$ is the previous test refresh rate (or fast refresh rate, if the first iteration), $K_R$ is the refresh rate factor, and x represents the iteration number. In the above equation, the previous test refresh rate is divided by the refresh rate factor; however, the refresh rate factor may multiply, divide, or perform any other mathematical operation. The refresh rate factor will influence the convergence of the method on an optimal refresh rate, and may be selected based on such considerations as extent of refresh rate optimization and amount of time dedicated to refresh rate optimization. For example, if the previous refresh rate is one refresh cycle every 32 milliseconds and the refresh rate factor is 2, the current refresh rate will be one refresh cycle every 64 milliseconds.

The rows are tested at the test refresh rate, as in 302. The rows may be tested through any method that allows for the determination of whether the cells in a row can hold a value for the test refresh rate duration. In an embodiment of the invention, a row may be tested by writing a "one" to the cells, and observing whether the cells in the row are able to hold that value. The rows may also be tested by writing a "zero" to the cells, and observing how many rows are able to hold the value. The cells may be tested for their ability to hold a value for one or both cell values. For example, if it is known that the cells in a row only lose a charge, taking the cell from "one" to "zero", the rows may only be tested by charging the cells to a "one" value. However, if cells are determined to both leak a charge and pick up charge or if interactions between stored "one" and "zero" values are found to have effects on their retention interval, then the rows may be tested with both a "one" charge and a "zero" charge.

In embodiments of the invention, the rows may be tested at start-up. Alternatively, the rows may be tested during normal operation of the system. If a weak row holding data is to be tested while the system is operated, the data from the weak row may be transferred to a row that is known to be a strong row so that the data is not lost during the test.

Determining Error Rate

The error rate for a test refresh rate is determined, as in operation 102. The error rate may be any measure of the ability of a row of cells to hold a charge at a refresh rate or over a series of refresh rates. For example, the error rate may be the percentage of cells that fail to hold a charge at a given refresh rate, or it may be the increase in the percentage of cells that fail to hold a charge from one iteration to the next.

In one embodiment, the error rate is the row error, which represents the percentage of rows with cells that fail to hold a cell value at a particular test refresh rate. The row error may be determined for the rows tested at the test refresh rate, as in operation 303. Row error may be represented by the following equation:

$$E_x = \frac{N_F}{N_T}$$

where $E_x$ is the row error, $N_F$ is the number of rows with cells that fail (fast rows), and $N_T$ is the total number of rows tested (fast rows and slow rows). In addition to refresh rate, the row error is also a function temperature of the DRAM. For example, the row error rate may be 0.03 if 3 out of 100 tested rows fail to hold a charge at the test refresh rate. In another embodiment, if the number of rows to be tested is known, the row error may be the number of rows that fail.

Evaluating Row Error Against Constraint

The error rate for a test rate may be evaluated against a constraint, as in operation 103. The row error may be evaluated against a row error constraint. The row error constraint may be determined, as in operation 304. The row error constraint sets the maximum allowable row error for a given refresh rate. The row error constraint may be a predetermined value, or it may be calculated by an equation or set of inputs. For example, the maximum row error for a slow refresh rate may be set at 95%, ensuring that at most 5% of the rows would be refreshed at the slow refresh rate.

The row error ($E_x$) may be compared against the row error constraint ($C_{ex}$), as in operation 305. If $C_{ex}$ is greater than $E_x$, then the DRAM may perform another iteration of the test sequence while incrementing x; this may involve storing the current test refresh rate ($R_x$) as the previous test refresh rate ($R_{x-1}$), as in operation 306. If C, is less than $E_x$, then the DRAM may set the slow refresh rate to the previous test refresh rate ($R_{x-1}$), as in operation 308. For example, if the row error is 0.03 and the row error constraint is 0.05, the method would perform another iteration. However, if the row error difference is 0.06, the method would stop iterating and the refresh rate of the last iteration may be set as the slow refresh rate.

Optimization Using Row Error Difference

Figure 4:
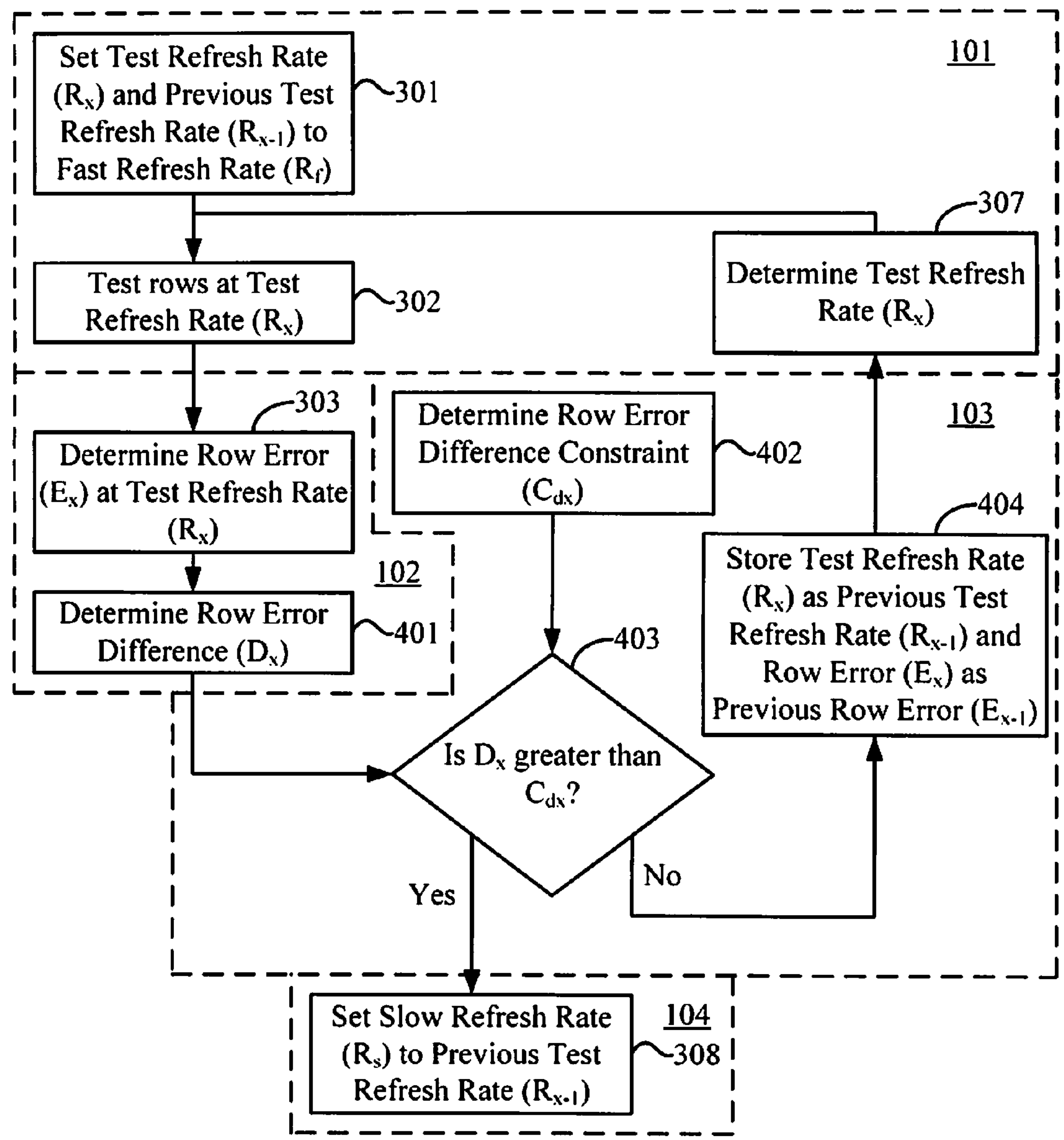
FIG. 4 is a flowchart of a refresh rate optimization method using row error difference, according to an embodiment of the invention.

FIG. 4 is a flowchart of an embodiment of the invention utilizing the change in row error for optimizing refresh rate. Row error from the current iteration and a previous iteration may be used to calculate a difference in row error, with that row error difference ($D_x$) evaluated against a row error difference constraint ($C_{dx}$). It may be desirable to use row error difference, as it gives an indication of the rate of change of row error with decreasing refresh rate. This may be used both for predictive purposes and in the event that absolute row error constraints are not available. For example, row error constraints may not be known or tested for, or may be so variable that constraints may not be established, such as for large temperature changes. By analyzing the change in the rate between two or more iterations, it may not be necessary to have values for the row error constraints, only for the rate of change of the row error values between iterations.

The steps for operations 301, 302, 303, and 307 are the same as discussed above. In operation 401, a row error difference may be determined from row error. The row error difference may be the difference in the row errors between the current iteration and the previous iteration, represented in the following equation:

$$D_x = E_x - E_{x-1}$$

where $D_x$ is the row error difference, $E_x$ is the current row error for the current test refresh rate, and $E_{x-1}$ is the previous row error for the previous test refresh rate. For a first iteration, the previous row error may be a predetermined value, such as zero; for subsequent iterations, the previous row error may be retrieved from storage. For example, if the previous row error is 0.01 (1%) and the current row error is 0.03 (3%), then the row error difference would be 0.02.

The row error difference constraint may be determined for the row error difference, as in 402. The row error difference constraint ($C_{dx}$) sets the maximum allowable error difference between the current refresh rate and the previous refresh rate. The constraint may be stored and retrieved, or it may be calculated by an equation or set of inputs. The row error difference constraint may be calculated by the equation below:

$$C_{dx} = \left(\frac{1}{K_R}\right)^x$$

where $C_{dx}$ is the row error difference constraint, x is the iteration number, and $K_R$ is the refresh rate factor, discussed above. For example, if the refresh rate factor is 2 and the method is on its third iteration, the row error constraint may be 0.125.

The row error difference ($D_x$) may be evaluated against the row error difference constraint ($C_{dx}$), as in 403. If $C_{dx}$ is greater than $D_x$, then the DRAM performs another iteration while incrementing x; this may involve storing the current test refresh rate ($R_x$) as the previous test refresh rate ($R_{x-1}$), and the row error ($E_x$) as the previous row error ($E_{x-1}$), as in 404. If $C_{dx}$ is less than $D_x$, then the DRAM may set the slow refresh rate to the previous test refresh rate ($R_{x-1}$), as in 308.

Figure 5:
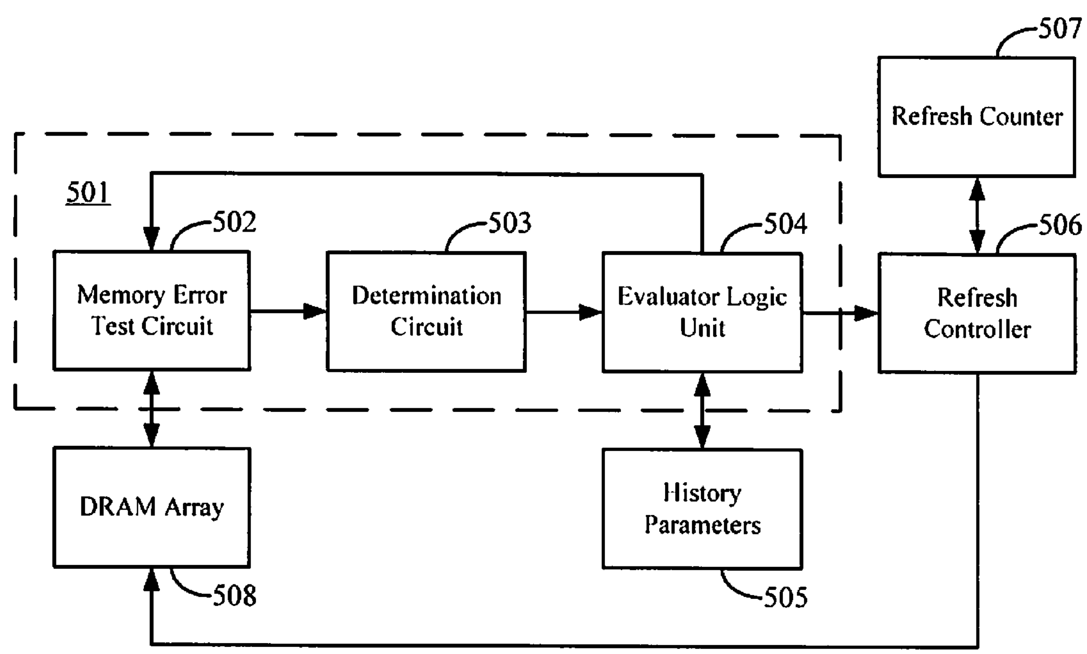
FIG. 5 is a diagrammatic representation of a hardware context in which a refresh rate optimization method may be implemented, according to principles of the invention.

FIG. 5 is a diagrammatic representation of a hardware implementation of the refresh optimization method, according to an embodiment of the invention. A memory controller 501 may determine refresh rate that refreshes a DRAM array 508. The memory controller 501 may contain a memory test circuit 502, a determination circuit 503, and an evaluation circuit 504. The memory test circuit 502 may test the DRAM array 508 at a test refresh rate. The test may involve putting a charge on a row of cells, reading the row of cells after a refresh interval corresponding to the refresh rate, and determining whether the row held the charge for the refresh interval. The determination circuit 503 may determine the error rate of the tested cells at the test refresh rate. The error rate determination may involve determining the fraction of the rows tested that failed to hold a charge in all their cells for the refresh interval. The determination circuit 503 may send error rate information to the evaluation circuit 504.

The evaluation circuit 504 may evaluate the error rate against a constraint. The constraint may be stored as history parameters 505, or may be calculated by the evaluation circuit 504 or other circuitry. History parameters 503 may include any stored data, whether temporary or permanent, regarding the refresh rate calculation. Permanent data may include constraint data and temporary data may include cell error, previous refresh rate, and the identities and locations of rows requiring a fast refresh rate. After the evaluation circuit 504 has evaluated the error rate against the constraint, the evaluation circuit 504 may send an increment signal back to the memory test circuit 502 if the error rate does not violate the constraint. After receiving an increment signal, the memory test circuit 502 may determine a new test refresh rate and initiate the testing, determination, and evaluation process explained above. Alternatively, if the evaluation circuit 504 determines that the error rate does violate the constraint, it may set the slow refresh rate and send the refresh rate information to a refresh controller 506. The refresh controller 506 may convert the information into refresh rate signals, which may be sent to a refresh rate counter 507 and the DRAM array 508 for refresh.

In another embodiment, a refresh rate optimization method may be implemented with discrete hardware or firmware components. The refresh rate optimization method discussed above may be achieved through logic circuits or programmable devices, such as programmable logic arrays (PLA) or application specific integrated circuits (ASIC). The firmware may be present on-board or off-board. The functions of the refresh rate optimization method may be performed through a combination of hardware and firmware.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A method for determining a slow refresh rate for a DRAM having at least a fast and a slow refresh rate, wherein the slow refresh rate is an adjustable rate used to identify an efficient total refresh time for the DRAM, the method comprising:

testing rows of the DRAM at a test refresh rate;

setting the tested rows of the DRAM which have an error to refresh at the fast refresh rate;

determining an error rate for the DRAM;

evaluating the error rate against a row error constraint; and determining the slow refresh rate if the error rate is greater than or equal to the constraint;

wherein a total refresh time is based on a first number of rows set to refresh at the fast refresh rate and a second number of rows set to refresh at the slow refresh rate.

2. The method of claim 1, wherein testing rows of the DRAM at the test refresh rate comprises setting a row of cells to a predetermined value and evaluating whether the cells hold the predetermined value for a refresh period.

3. The method of claim 1, wherein determining the error rate comprises determining a row error, wherein the row error is the fraction of rows tested that fail to hold a predetermined value for a refresh period.

4. The method of claim 1, wherein the row error constraint is either a predetermined value or a calculated value.

5. The method of claim 1, further comprising:

changing the test refresh rate to a new test refresh rate;

testing rows the DRAM at the new test refresh rate;

setting rows of the DRAM tested at the new refresh rate which have an error to refresh at the fast refresh rate;

determining a new error rate for the DRAM;

evaluating the new error rate against the row error constraint;

wherein the changing, testing, determining, and evaluating are repeated until the new error rate is greater than the row error constraint.

6. The method of claim 5, wherein:

the test refresh rate is the fast refresh rate for a first iteration; and the new test refresh rate is the test refresh rate multiplied by a refresh rate factor for any iteration after the first iteration.

7. The method of claim 5, wherein determining the error rate comprises determining a row error difference, wherein the row error difference is the difference between a row error of a current iteration and a row error of a previous iteration, and wherein the row error is the fraction of rows tested that fail to hold a predetermined value for a refresh period and wherein the row error constraint is a row error difference constraint.

8. The method of claim 7, wherein the row error difference constraint is a function of a refresh rate factor.

9. The method of claim 5, wherein the slow refresh rate is set to the test refresh rate of a corresponding error rate which is less than the row error constraint.

10. The method of claim 1, wherein testing rows at a test refresh rate is performed during system operation.

11. A controller for determining a slow refresh rate for a DRAM having at least a fast and a slow refresh rate, wherein the slow refresh rate is an adjustable rate used to identify an efficient total refresh time for the DRAM, the controller comprising:

a memory error test circuit for testing rows of the DRAM at a test refresh rate and setting rows of the DRAM which have an error to refresh at the fast refresh rate;

a determination circuit for determining an error rate for the DRAM; and an evaluator logic unit for evaluating the error rate against a row error constraint and setting the slow refresh rate when the error rate is greater than the row error constraint;

wherein a total refresh time is based on a first number of rows set to be refreshed at the fast refresh rate and a second number of rows set to be refreshed at the slow refresh rate.

12. The controller of claim 11, wherein the controller provides for testing at a changed test refresh rate until the evaluator logic unit determines that the error rate is greater than the row error constraint.

13. The controller of claim 11, wherein the memory error test circuit determines the test refresh rate.

14. The controller of claim 11, further comprising a storage circuit for storing a history of refresh information.

15. The controller of claim 14, wherein the history of refresh information includes the row error constraint as a predetermined value.

16. A method for determining a total refresh time for a DRAM having at least a fast and a slow refresh rate, comprising:

testing rows of a DRAM at a test refresh rate;

setting one or more rows of the DRAM to refresh at the fast refresh rate in response to failing the test;

determining a total refresh time, wherein the total refresh time is based on a first number of rows set to be refreshed at the fast refresh rate and a second number of rows set to be refreshed at the test refresh rate.

17. The method of claim 16, further comprising:

changing the test refresh rate to a new test refresh rate;

testing rows the DRAM at the new test refresh rate;

setting rows of the DRAM tested at the new refresh rate to refresh at the fast refresh rate in response to failing the test at the new test refresh rate; and determining a new total refresh time based on the number of rows refreshed at the fast refresh rate and the number of rows refreshed at the new test refresh rate; and repeating the changing, testing, setting, and determining when the new total refresh time is less than the total refresh time.

18. The method of claim 17, wherein the slow refresh rate is set to the new test refresh rate.

19. The method of claim 16, further comprising determining an error rate for the DRAM, wherein the error rate is the one or more rows of the DRAM set to be refreshed at the fast refresh rate as a percentage of a total number of tested rows of the DRAM.

20. The method of claim 19, wherein determining the error rate comprises determining a row error difference, wherein the row error difference is the difference between a row error of a current iteration and a row error of a previous iteration, and wherein the row error is the fraction of rows tested that fail to hold a predetermined value for a refresh period and wherein the row error constraint is a row error difference constraint.

* * * * *